(12) United States Patent
Lee et al.

(10) Patent No.: US 10,147,789 B2
(45) Date of Patent: Dec. 4, 2018

(54) PROCESS FOR FABRICATING VERTICALLY-ALIGNED GALLIUM ARSENIDE SEMICONDUCTOR NANOWIRE ARRAY OF LARGE AREA

(71) Applicant: KOREA RESEARCH INSTITUTE OF STANDARDS AND SCIENCE, Daejeon (KR)

(72) Inventors: Woo Lee, Daejeon (KR); Jeong Ho Shin, Daejeon (KR)

(73) Assignee: Korea Research Institute of Standards and Science, Daejeon (KR)

( * ) Notice: Subject to any disclaimer, the term of this patent is extended or adjusted under 35 U.S.C. 154(b) by 0 days.

(21) Appl. No.: 15/317,922

(22) PCT Filed: Jun. 25, 2014

(86) PCT No.: PCT/KR2014/005645
§ 371 (c)(1),
(2) Date: Dec. 9, 2016

(87) PCT Pub. No.: WO2015/190637
PCT Pub. Date: Dec. 17, 2015

(65) Prior Publication Data
US 2017/0125519 A1    May 4, 2017

(30) Foreign Application Priority Data
Jun. 11, 2014  (KR) .................. 10-2014-0070745

(51) Int. Cl.
*H01L 29/06*  (2006.01)
*H01L 21/306* (2006.01)
(Continued)

(52) U.S. Cl.
CPC ............ *H01L 29/0676* (2013.01); *B82B 3/00* (2013.01); *B82Y 10/00* (2013.01); *B82Y 40/00* (2013.01);
(Continued)

(58) Field of Classification Search
None
See application file for complete search history.

(56) References Cited

U.S. PATENT DOCUMENTS

| | | | | |
|---|---|---|---|---|
| 4,404,072 A | * | 9/1983 | Kohl | ......................... C25F 3/12 205/655 |
| 5,773,369 A | * | 6/1998 | Hu | ............................ C25F 3/12 205/655 |

(Continued)

FOREIGN PATENT DOCUMENTS

| | | |
|---|---|---|
| JP | 2004500250 A | 1/2004 |
| JP | 2008243850 A | 10/2008 |

(Continued)

OTHER PUBLICATIONS

ISA Korean Intellectual Property Office, International Search Report Issued in Application No. PCT/KR2014/005645, dated Mar. 11, 2015, WIPO, 4 pages.

(Continued)

*Primary Examiner* — Allan Olsen
(74) *Attorney, Agent, or Firm* — McCoy Russell LLP

(57) ABSTRACT

The present invention relates to a method for manufacturing a GaAs semiconductor nanowire in a bottom-up type and, more particularly, to a method for manufacturing a vertically-aligned gallium arsenide semiconductor nanowire array in a large area by applying a voltage and a current from the outside using a metal thin film, which has been made through an economical method of fabricating a mesh-type metal thin film in a large area, as an anode such that holes (Continued)

(h⁺) are injected into a gallium arsenide substrate, thereby inducing a wet etching process continuously. The obtained vertically-aligned gallium arsenide semiconductor nanowire of a large area can be applied to fabrication of nanoelements, such as a solar cell, a transistor, and a light-emitting diode.

8 Claims, 7 Drawing Sheets

(51) Int. Cl.
*H01L 29/20* (2006.01)
*B82B 3/00* (2006.01)
*B82Y 10/00* (2011.01)
*B82Y 40/00* (2011.01)
*H01L 21/3063* (2006.01)
*H01L 21/308* (2006.01)

(52) U.S. Cl.
CPC .... *H01L 21/3086* (2013.01); *H01L 21/30612* (2013.01); *H01L 21/30635* (2013.01); *H01L 29/20* (2013.01); *B82B 3/0014* (2013.01); *B82B 3/0019* (2013.01); *Y10S 977/762* (2013.01); *Y10S 977/819* (2013.01); *Y10S 977/888* (2013.01)

(56) References Cited

U.S. PATENT DOCUMENTS

| | | | | |
|---|---|---|---|---|
| 8,569,085 B2* | 10/2013 | Tamboli | | H01L 33/0062 257/79 |
| 8,951,430 B2* | 2/2015 | Li | | H01L 21/30612 216/56 |
| 9,583,353 B2* | 2/2017 | Han | | H01L 21/30612 |
| 9,691,849 B2* | 6/2017 | Weisse | | H01L 21/30604 |
| 2002/0066319 A1* | 6/2002 | Beach | | G01L 9/0055 73/754 |
| 2003/0010971 A1* | 1/2003 | Zhang | | B82Y 10/00 257/15 |
| 2008/0260941 A1* | 10/2008 | Jin | | B01J 35/0013 427/126.4 |
| 2009/0127567 A1* | 5/2009 | Wang | | C25D 15/00 257/79 |
| 2009/0142656 A1* | 6/2009 | Nathan | | H01M 2/0202 429/129 |
| 2010/0248449 A1* | 9/2010 | Hildreth | | B81C 1/00071 438/460 |
| 2010/0276665 A1* | 11/2010 | Wang | | H01L 21/0237 257/15 |
| 2010/0317132 A1* | 12/2010 | Rogers | | H01L 25/0753 438/27 |
| 2013/0214287 A1* | 8/2013 | Okamoto | | H01L 21/8252 257/76 |
| 2013/0280908 A1* | 10/2013 | Li | | H01L 21/30612 438/674 |
| 2014/0170303 A1* | 6/2014 | Rayner | | C25D 1/00 427/58 |
| 2015/0108632 A1* | 4/2015 | Sun | | H01C 7/006 257/720 |
| 2017/0194148 A1* | 7/2017 | Breymesser | | H01L 21/2252 |
| 2017/0200707 A1* | 7/2017 | Rogers | | H01L 25/0753 |

FOREIGN PATENT DOCUMENTS

| | | |
|---|---|---|
| JP | 2012246216 A | 12/2012 |
| KR | 1020100002486 A | 1/2010 |
| KR | 1020110024892 A | 3/2011 |
| KR | 1020130017684 A | 2/2013 |
| WO | 2013093504 A2 | 6/2013 |

OTHER PUBLICATIONS

Japan Patent Office, Office Action Issued in Application No. 2016-572503, dated Jan. 9, 2018, 7 pages. (Submitted with Machine Translation).

* cited by examiner

PROCESS FOR FABRICATING VERTICALLY-ALIGNED GALLIUM ARSENIDE SEMICONDUCTOR NANOWIRE ARRAY OF LARGE AREA

CROSS-REFERENCE TO REALATED APPLICATIONS

The present application is a U.S. National Phase of International Patent Application Serial No. PCT/KR2014/005645, entitled "PROCESS FOR FABRICATING VERTI-CALLY-ASSIGNED GALLIUM ARSENIDE SEMICONDUCTOR NANOWIRE ARRAY OF LARGE AREA," filed on Jun. 25, 2014. International Patent Application Serial No. PCT/KR2014/005645 claims priority to Korean Patent Application No. 10-2014-0070745, filed on Jun. 11, 2014. The entire contents of each of the above-cited applications are hereby incorporated by reference for all purposes.

TECHNICAL FIELD

The present invention relates to a method for economically fabricating a metal mesh thin film.

In addition, the present invention relates to a method for fabricating a vertically-aligned gallium arsenide semiconductor nanowire array using the method described above.

More particularly, the present invention relates to a method for fabricating a vertically-aligned gallium arsenide semiconductor nanowire array having a controlled diameter and length, a wide surface area, and a large aspect ratio in a large area by applying a voltage or a current from the outside using a metal thin film having aligned nanoscale holes as an anode to inject holes $h^+$ into a gallium arsenide substrate and wet-etching a semiconductor substrate having a crystallographic orientation.

BACKGROUND ART

Recently, due to unique physical and structural characteristics of a low dimensional semiconductor nanostructure, a study for using the low dimensional semiconductor nanostructure as a high-performance element using a semiconductor nanowire has been actively conducted. As compared with single crystal semiconductors formed of a single element such as silicon (Si), germanium (Ge), or the like, compound semiconductors formed of two kinds or more elements may implement several kinds of semiconductor nanoelements appropriate for purposes using a combination and a composition ratio of various elements.

Among them, a gallium arsenide, which is a group III-V semiconductor, may fabricate many high-speed integrated circuits due to a moving speed of electrons five times faster than that of silicon and a simple transistor structure. In addition, the gallium arsenide may process a high frequency band up to 250 GHz, and is less affected by a temperature change, such that noise at the time of an operation is lower than that of the silicon. First of all, the gallium arsenide has direct bandgap semiconductor characteristics to have excellent light emitting efficiency. Therefore, recently, the gallium arsenide has become prominent as a material of a light emitting diode (LED) or a solar cell module that has been rapidly grown.

Therefore, in order to use gallium arsenide nanowires as an actual element, it should be first performed to spatially align well a high-quality vertically-aligned gallium arsenide semiconductor nanowire array having a wide surface area and a large aspect ratio and adjust a density of the high-quality vertically-aligned gallium arsenide semiconductor nanowire array as well as it is necessary to uniformly control diameters and lengths of the nanowires.

According to reports up to now, a method for growing the gallium arsenide nanowires may be mainly classified into a top-down method and a bottom-up method.

The gallium arsenide nanowires may be grown using molecular beam epitaxy (MBE), metal organic chemical vapor deposition (MOCVD), or the like, as the top-down method. However, in the top-down method, a defect such as a twin occurs at the time of growing the nanowires, and it is difficult to vertically align the nanowires having a uniform length and diameter from a substrate. In addition, the bottom-up method may be divided into dry etching and wet etching. Reactive ion etching (ME), which is a representative example of the dry etching, requires expensive equipment, may cause damage to a material in a process, and may cause a surface that is non-uniform and includes a large amount of impurities. Therefore, the RIE may have a large influence on physical and chemical characteristics, such that it may become a variable in designing an element, which is not preferable.

Meanwhile, the wet etching of which a representative example is metal-assisted chemical etching has been most actively studied currently in fabricating silicon nanowires, and is a method for obtaining nanowires of which lengths and diameters are controlled at a short time by immersing a patterned thin film in an etchant including an oxidizing agent using a metal as a catalyst to induce a spontaneous reaction. A study range of this method has increased in fabricating group III-V semiconductor nanowires including the gallium arsenide.

However, in the case of a group III-V semiconductor substrate including the gallium arsenide, at the time of performing chemical etching using the metal as the catalyst, vertical etching and side etching are simultaneously generated, such that it is difficult to fabricate nanowires having a uniform diameter and length and it is difficult to fabricate nanowires having a large aspect ratio.

DISCLOSURE

Technical Problem

An object of the present invention is to provide a vertically-aligned gallium arsenide semiconductor nanowire array having a uniform diameter and length by overcoming several technical limitations of a process for fabricating a gallium arsenide semiconductor nanowire array through chemical wet etching of a gallium arsenide semiconductor substrate using a metal as a catalyst according to the related art.

In addition, an object of the present invention is to provide a technology for fabricating the vertically-aligned gallium arsenide semiconductor nanowire array having the uniform diameter and length in a large area.

Further, another object of the present invention is to provide a method capable of overcoming a length limitation due to a side etching effect universally appearing in a group III-V semiconductor substrate by fabricating nanowires having a uniform diameter and a large aspect ratio by suppressing side etching.

Further, an object of the present invention is to provide a method capable of fabricating a vertically-aligned gallium arsenide nanowire array regardless of a doping concentration and a doping kind of gallium arsenide substrate.

Further, an object of the present invention is to provide a method capable of fabricating a vertically-aligned gallium arsenide nanowire array having the same directivity as that of a substrate regardless of a substrate of which a crystallographic orientation is different from that of the vertically-aligned gallium arsenide nanowire array.

Further, an object of the present invention is to provide a method capable of fabricating a gallium arsenide nanowire array having one or more crystallographic orientations, fabricating a gallium arsenide nanowire array in a zigzag form in which crystallographic orientations periodically intersect with each other, and fabricating a porous gallium arsenide nanowire array by controlling etching directions of gallium arsenide nanowires fabricated on a gallium arsenide substrate having one crystallographic orientation.

Technical Solution

In one general aspect, a method for fabricating a gallium arsenide nanowire array includes: (a) preparing a patterned metal mesh on a surface of a gallium arsenide substrate; and (b) wet-etching the gallium arsenide substrate in an etchant by applying an external bias to the metal mesh.

According to an aspect of the present invention, the step (a) may further include: (a1) forming an organic particle monolayer array on the gallium arsenide substrate; (a2) depositing a metal thin film on the organic particle monolayer array; and (a3) removing the organic particle monolayer array to fabricate the metal mesh.

In addition, according to an aspect of the present invention, the step (a1) may further include pre-treating the gallium arsenide substrate.

In addition, according to an aspect of the present invention, after the step (a2), heat may be applied or plasma treatment may be performed under an oxide atmosphere (an air or oxygen or ozone atmosphere) to contract organic particles of the organic particle monolayer array, thereby increasing a gap between arrays to adjust distance between nanowires.

Hereinafter, an aspect of the present invention will be described in detail.

In one general aspect, a method for fabricating a group III-V compound semiconductor nanowire array includes: (a) preparing a patterned metal mesh on a surface of a group III-V compound semiconductor substrate; and (b) wet-etching a gallium arsenide substrate in an etchant by applying an external bias to the metal mesh.

According to an aspect of the present invention, the step (a) may further include: (a1) forming an organic particle monolayer array on the gallium arsenide substrate; (a2) depositing a metal thin film on the organic particle monolayer array; and (a3) removing the organic particle monolayer array to fabricate the metal mesh.

According to an aspect of the present invention, the method for fabricating a group III-V compound semiconductor nanowire array may further include, after the step (a2), applying heat or performing plasma treatment under an air or oxygen or ozone atmosphere to contract organic particles of the organic particle monolayer array, thereby increasing a gap between arrays.

According to an aspect of the present invention, holes of the metal mesh may have at least one of a circular shape, an oval shape, a square shape, a rectangular shape, a fiber shape, and a polygonal shape.

According to an aspect of the present invention, a voltage or a current is applied to the metal mesh using the metal mesh using an anode.

According to an aspect of the present invention, the metal mesh includes a metal including silver (Ag), gold (Au), palladium (Pd), or platinum (Pt) that is not corroded by the etchant. According to an aspect of the present invention, the metal mesh is formed of an alloy of two or more elements or is formed of two or more metals deposited as multiple layers. In addition, the metal mesh may be fabricated through various patterning methods in addition to a fabricating method using the organic particles.

In addition, a length of a nanowire is controlled by a time in which the wet-etching is performed or is controlled by a magnitude of the applied bias.

In addition, the etchant includes hydrofluoric acid (HF), hydrochloric acid (HCl), or nitric acid ($HNO_3$).

In addition, in the wet-etching, a nanowire is fabricated to be vertical to the substrate or is fabricated in a zigzag form. In addition, in the wet-etching, the bias is applied to the substrate to induce a nanowire to have a porous surface.

In addition, in the wet-etching, a diameter of a nanowire is adjusted depending on a change in a size of a hole of the metal mesh.

A group III-V compound semiconductor may be a gallium arsenide.

Hereinafter, the method for fabricating a group III-V compound semiconductor nanowire array will be described.

In the present invention, the forming of the organic particle monolayer array of the step (a1) is based on that the organic particle monolayer array is formed over the entirety of the gallium arsenide substrate, but the organic particle monolayer array may also be formed on only portions of the gallium arsenide substrate if necessary, and the organic particle monolayer array is formed to have plural layers such as two layers, three layers, or the like, such that the gallium arsenide nanowires may be fabricated in an atypical form rather than a vertical form. All of these plural layers may be formed or only some of these plural layers may be formed, if necessary, and these plural layers may be formed to be mixed with each other. In the present invention, although it is obvious to those skilled in the art that a monolayer array may have a partial defect even in the case of forming the monolayer array, it is probabilistically most preferable to form a monolayer in a close-packed form.

In the present invention, it is preferable to pre-treat the gallium arsenide substrate for the purpose of uniformity of the nanowires formed by removing pollutants. It is preferable to perform the pre-treatment by water-cleaning alternatively using an organic solvent and ionized water. The organic solvent is not limited as long as it does not damage the gallium arsenide substrate, and may be, for example, acetone, ketone, ethanol, methanol, ethyl ether, ethyl acetate, tetrahydrofuran, or the like, but is not limited thereto. The pre-treatment may be performed in eddy or be performed by allowing to flow. That is, various means may be adopted as a pre-treatment means.

In a method for forming the organic particle monolayer array on the gallium arsenide substrate according to the present invention, the organic particle monolayer array is formed by dispersing the organic particles in a monolayer form on a surface of a solvent or water and then transferring the organic particles to the gallium arsenide substrate. A transfer method may be variously adopted. For example, the organic particles may form the monolayer array on the surface of the gallium arsenide substrate by injecting the gallium arsenide substrate into a liquid-phase medium in which the organic particles are dispersed and then slowly pulling out the gallium arsenide substrate from the liquid-phase medium. It is obvious that various media may be adopted as the liquid-phase medium depending on a property of the organic particle. For example, the liquid-phase medium may be water or organic solvents used for the pre-treatment, but is not limited thereto.

In the present invention, a size of the organic particle may be variously adjusted to 1 nm to 5000 μm, preferably, 10 nm to 100 μm, more preferably 10 nm to 10 μm, but is not limited thereto. The organic particle may be various kinds of particles such as a polystyrene particle, a polymethylmethacrylate particle, a polyolefin particle, a polyvinylacetate particle, a polybutadiene particle, a crosslinked acrylic particle, an epoxy particle, other rubber particles, and the like, but is not limited thereto. Since the polystyrene particle floats on water due to a low specific gravity and is most commercialized, the organic particle is, preferably, the polystyrene particle, but is not limited thereto.

In addition, in the present invention, the organic particle may have various shapes such as a circular shape, an oval shape, a square shape, a rectangular shape, a fiber shape, a plate shape, and the nanowire fabricated in the present invention may have various shapes depending on the shape of the organic particle. The reason is that the shape of the hole of the metal mesh is determined depending on the shape of the organic particle and the shape of the nanowire is determined depending on the shape of the metal mesh.

Meanwhile, in the present invention, after the step (a2), heat may be applied or plasma treatment may be performed under an oxide atmosphere (an air or oxygen or ozone atmosphere) to contract the organic particles of the organic particle monolayer array, thereby increasing a gap between arrays to adjust distance between nanowires. A reason of a phenomenon that the organic particles are contracted through this step is that a volume of the organic particles crosslinked with each other or expanded by plasma treatment or heat treatment is densely contracted. Since the organic particles should not be melted in the case of performing the heat treatment, it is preferable to perform the heat treatment at a temperature that is equal to or higher than a glass transition temperature and is less than a melting temperature.

The depositing of the metal thin film adopted in the step (a2) may be various existing methods for forming a metal thin film adopted in this technology or similar technologies, and thus, is not limited to a special method. For example, palladium (Pd), gold (Au), platinum (Pt), or silver (Ag) used as a material of an electrode at the time of fabricating the nanowire array may be deposited, and the metal may be deposited through thermal evaporation, plasma sputtering, or e-beam evaporation.

Next, the step (a3) of the present invention will be described. The step (a3) of the present invention is a process for removing the organic particles after the depositing of the metal. The organic particles are removed, such that attachment positions at which the organic particles are attached onto the gallium arsenide substrate are formed in a mesh form. The organic particles may be removed by dissolving by a solvent or be physically removed by putting the organic particles in a non-solvent and then performing ultrasonic treatment, or the like, but is not limited thereto. As an example, in the case of adopting the polystyrene particles in the present invention, the gallium arsenide substrate is put in toluene or chloroform, and ultrasonic treatment is performed on the gallium arsenide substrate to remove the polystyrene nanoparticles aligned on the surface of the gallium arsenide substrate, thereby making it possible to fabricate the porous metal mesh.

When the organic particles are removed as described above, the mesh is formed due to a deviation between a thickness of the metal thin film and a height of attachment places of the organic particles on the gallium arsenide substrate on which the metal thin film is deposited.

According to an exemplary embodiment of the present invention, a cross section of the hole of the porous metal mesh may have at least any one of a circular shape, an oval shape, a square shape, a rectangular shape, and a regular polygonal shape.

In addition, a material of the porous metal mesh used in the present invention may be gold (Au), silver (Ag), palladium (Pd), or platinum (Pt) having excellent characteristics, but is not limited. In addition, the material of the porous metal mesh may include a metal that is not corroded by a specific etchant.

Next, the step (b) according to an aspect of the present invention will be described.

The step (b) may be characterized in that the gallium arsenide substrate is wet-etched using the porous metal mesh prepared through the step (a) to form the nanowires. According to an aspect of the present invention, in the step (b), the external bias is directly applied to the porous metal mesh to form holes $h^+$ in the gallium arsenide substrate contacting a lower portion of the porous metal mesh, and the gallium arsenide substrate is wet-etched in the etchant, such that the nanowires are formed in a top-down scheme.

That is, the gallium arsenide substrate contacting the porous metal mesh is lowered while being etched, and a mesh-shaped portion that does not contact the porous metal mesh is not etched, such that nanowire shapes are generated.

In the present invention, power applied from the outside may include a direct current (DC) current, voltage, and a pulse form thereof.

In this case, an aspect ratio (=length/diameter) of the obtained gallium arsenide nanowire is controlled by adjusting the applied oxidation voltage or oxidation current, a concentration of etchant, and an etching time.

According to an aspect of the present invention, the etchant used in the step (b) may include all solutions that may etch a gallium arsenide, such as hydrofluoric acid (HF), hydrochloric acid (HCl), nitric acid ($HNO_3$), or the like, but is not limited thereto. In addition, a gallium arsenide etchant used in the present invention may include an etchant diluted with deionized water, and may be a mixture of deionized water and anhydrous ethanol ($C_2H_5OH$), but is not limited thereto.

In the present invention, the bias may be applied to the metal thin film within a current of 0.5 to 50 mA (a current density of 2.5 to 250 $mA/cm^2$) or a voltage of 0.2 to 10V.

Meanwhile, in the present invention, the bias may also be applied to a doped gallium arsenide substrate. The present invention in which the gallium arsenide nanowires are fabricated by inducing electrochemical etching of the gallium arsenide substrate by the DC current or voltage applied from the outside has an advantage that the nanowires may be fabricated regardless of a doping concentration of a predetermined doping concentration or more and a doping type when it has electrical characteristics at the predetermined doping concentration or more, and generally has an advantage that an additional doping process is not required since a wafer having a required doping concentration is directly etched without performing a separate doping process in order to fabricate a gallium arsenide substrate having desired electrical characteristics.

Etching directions of gallium arsenide nanowires fabricated on a gallium arsenide substrate having one crystallographic orientation are controlled, thereby making it possible to fabricate a gallium arsenide nanowire array having one or more crystallographic orientations, fabricate a gallium arsenide nanowire array in a zigzag form in which crystallographic orientations periodically intersect with each other, and fabricate a porous gallium arsenide nanowire array.

That is, a magnitude and a pulse form of the DC voltage or current applied to the metal thin film are adjusted to control etching directions of nanowires fabricated on a gallium arsenide substrate having a given crystallographic orientation, thereby making it possible to fabricate the gallium arsenide nanowire array having one crystallographic orientation or one or more crystallographic orientations and fabricate the gallium arsenide nanowire array in a zigzag form in which crystallographic orientations periodically intersect with each other.

Furthermore, the DC current or voltage is not applied to the metal mesh, but is directly applied to the gallium arsenide substrate, thereby making it possible to fabricate the porous gallium arsenide nanowire array.

Advantageous Effects

According to the method for fabricating a gallium arsenide nanowire array according to the present invention, since a vertically-aligned gallium arsenide nanowire array may be fabricated regardless of a doping concentration and a doping kind of gallium arsenide substrate, nanowires may be directly fabricated using a substrate having a required doping concentration and kind in implementing an element without performing an additional doping process.

In addition, it is possible to fabricate a vertically-aligned gallium arsenide nanowire array having the same directivity as that of a substrate regardless of a substrate of which a crystallographic orientation is different from that of the vertically-aligned gallium arsenide nanowire array.

It is possible to fabricate a vertically-aligned gallium arsenide nanowire array having the same directivity as that of a substrate regardless of a substrate of which a crystallographic orientation is different from that of the vertically-aligned gallium arsenide nanowire array.

In addition, etching directions of gallium arsenide nanowires fabricated on a gallium arsenide substrate having one crystallographic orientation are controlled, thereby making it possible to fabricate a gallium arsenide nanowire array having one or more crystallographic orientations, fabricate a gallium arsenide nanowire array in a zigzag form in which crystallographic orientations periodically intersect with each other, and fabricate a porous gallium arsenide nanowire array.

Furthermore, side etching is suppressed to fabricate nanowires having a uniform diameter and a large aspect ratio, thereby making it possible to overcome a length limitation due to a side etching effect universally appearing in a group III-V semiconductor substrate.

BEST MODE

Figure 1:
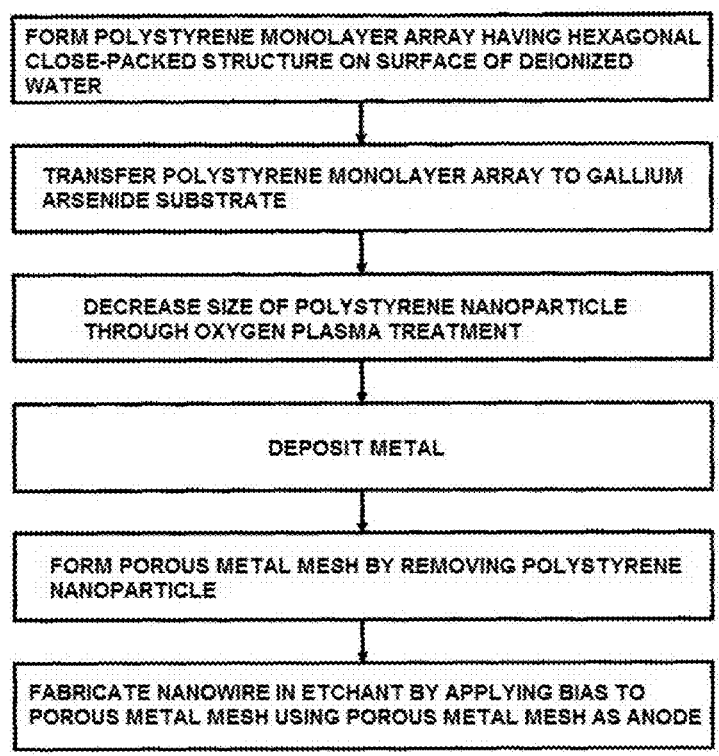
FIG. 1 is a flow chart illustrating a method for fabricating a gallium arsenide semiconductor nanowire array according to an exemplary embodiment of the present invention.

The present invention may be variously modified and have several exemplary embodiments. Therefore, specific exemplary embodiments of the present invention will be illustrated in the accompanying drawings and be described in detail in the present specification. However, it is to be understood that the present invention is not limited to the specific exemplary embodiments, but includes all modifications, equivalents, and substitutions included in the spirit and the scope of the present invention. When it is determined that the detailed description of the known art related to the present invention may obscure the gist of the present invention, the detailed description thereof will be omitted.

Terms used in the specification, 'first', 'second', etc., may be used to describe various components, but the components are not to be interpreted to be limited to the terms. The terms are used only to distinguish one component from another component.

Terms used in the present specification are used only in order to describe specific exemplary embodiments rather than limiting the present invention. Singular forms are intended to include plural forms unless the context clearly indicates otherwise. It will be further understood that the terms "include" or "have" used in this specification, specify the presence of features, numerals, steps, operations, components, parts mentioned in the present specification, or a combination thereof, but do not preclude the presence or addition of one or more other features, numerals, steps, operations, components, parts, or a combination thereof.

Hereinafter, the preset invention will be described in more detail with reference to the accompanying drawings corresponding to an aspect of the present invention. In describing the present invention with reference to the accompanying drawings, components that are the same as or correspond to each other will be denoted by the same reference numerals, and an overlapped description therefor will be omitted.

First, a method for fabricating a gallium arsenide semiconductor nanowire array according to the present invention will be described in detail with reference to FIG. 1.

First, a polystyrene particle monolayer array having a hexagonal close-packed structure (in the case of closest packing) is formed on a surface of a deionized water. Then, the polystyrene particle monolayer array is transferred to a gallium arsenide substrate, and is subjected to oxygen plasma treatment to contract the polystyrene particle. Then, a metal thin film is deposited by a general deposition method, and the polystyrene particle is removed. Then, a bias is applied to the porous metal mesh using a porous metal mesh as an anode to etch a contact surface between the gallium arsenide substrate and the metal thin film using an etchant, and a mesh portion, which is a non-contact portion between the gallium arsenide substrate and the metal thin film, is not etched, such that gallium arsenide nanowires are generated in a top-down scheme.

Hereinafter, a step of fabricating a metal mesh of FIG. 7 will be described with reference to FIGS. 2 to 6.

According to a method for fabricating a gallium arsenide nanowire array according to the present invention, a porous metal mesh should be first prepared.

Figure 2:
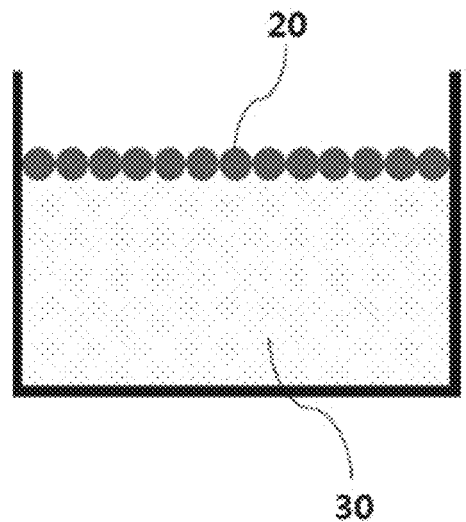
FIG. 2 is a cross-sectional view illustrating a polystyrene nanoparticle monolayer array formed on a surface of a deionized water according to an exemplary embodiment of the present invention.
Figure 3:
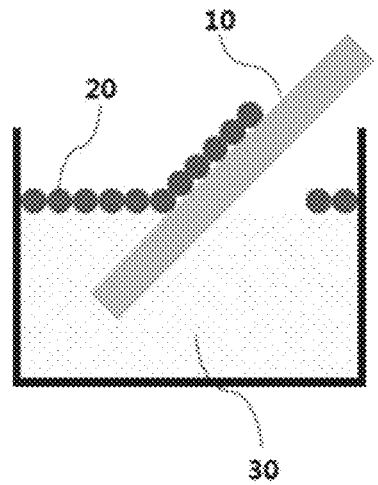
FIG. 3 is a cross-sectional view illustrating a method for transferring the polystyrene nanoparticle monolayer array onto a surface of a gallium arsenide substrate according to an exemplary embodiment of the present invention.

In order to fabricate the porous metal mesh, polystyrene nanoparticles 20 are dispersed as a monolayer in a deionized water 30, as illustrated in FIG. 2. Then, as illustrated in FIG. 3, a gallium arsenide substrate 10 is impregnated and pulled up to a polystyrene nanoparticle monolayer array 20 on a surface of the gallium arsenide substrate 10. That is, the polystyrene nanoparticle monolayer array aligned in a close-packed structure on the surface of the deionized water as illustrated in FIG. 3 from the polystyrene nanoparticle monolayer array 20 formed on a surface of the deionized water 30 of FIG. 2 is transferred to the gallium arsenide substrate 10. In addition to this transfer method, various means may be adopted. For example, the various means may be various methods such as spin coating, knife coating, and the like, but are not limited thereto.

Figure 4:
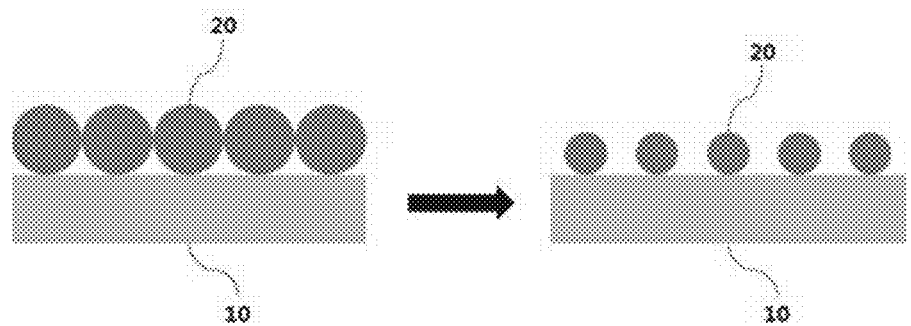
FIG. 4 is a cross-sectional view illustrating a method for decreasing sizes of polystyrene nanoparticles according to an exemplary embodiment of the present invention.

Then, as illustrated in FIG. 4, diameters of polystyrene nanoparticles should be decreased through oxygen plasma treatment of the polystyrene nanoparticle monolayer array transferred to the surface of the gallium arsenide substrate.

Figure 5:
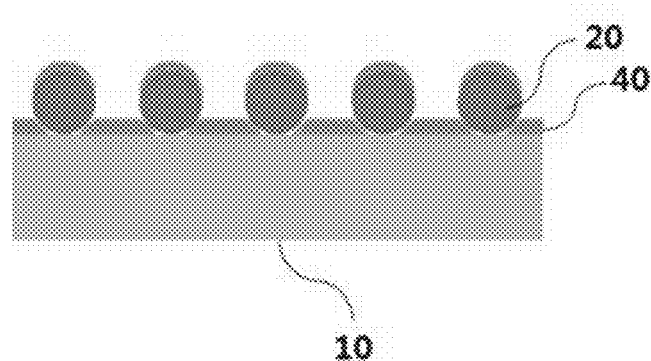
FIG. 5 is a cross-sectional view illustrating a metal thin film deposited on the polystyrene nanoparticle monolayer array formed on the gallium arsenide substrate according to an exemplary embodiment of the present invention.

Then, as illustrated in FIG. 5, a metal is deposited on the gallium arsenide substrate on which the polystyrene nanoparticle monolayer array 20 is aligned. An example of a method for depositing the metal may include thermal evaporation, plasma sputtering, e-beam evaporation, or the like.

Figure 6:
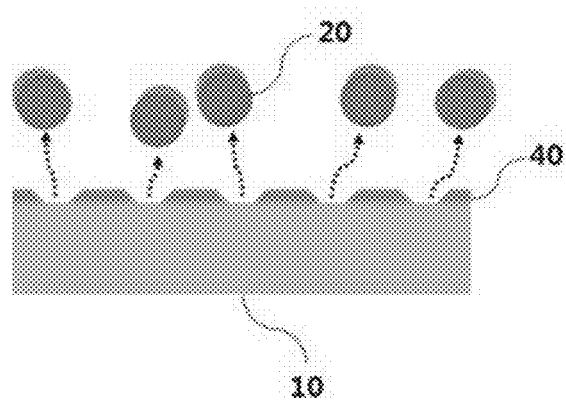
FIG. 6 is a cross-sectional view illustrating a process for removing polystyrene according to an exemplary embodiment of the present invention.

Next, as illustrated in FIG. 6, the gallium arsenide substrate is immersed in toluene or chloroform to remove the polystyrene nanoparticle monolayer array 20, thereby fabricating a porous metal mesh 40.

Figure 7:
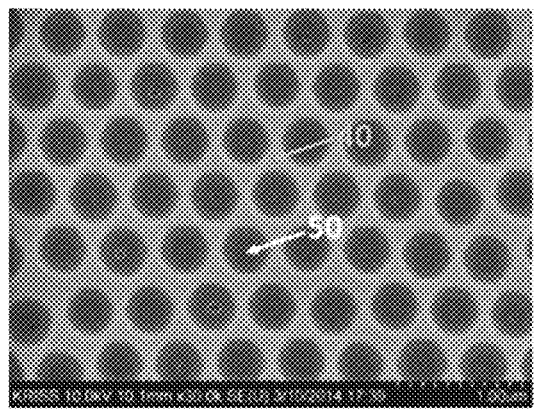
FIG. 7 is a scanning electron microscope (SEM) photograph of a porous metal mesh formed on the gallium arsenide substrate according to an exemplary embodiment of the present invention.

FIG. 7 is a scanning electron microscope (SEM) photograph of the porous metal mesh 40 fabricated according to an exemplary embodiment of the present invention. Holes 50 of the porous metal mesh have sizes of nanometers (nm) to micrometers (μm), sizes of the holes may be adjusted depending on sizes of the polystyrene nanoparticles or an oxygen plasma treatment time, and cross sections of the holes may have various shapes such as a circular shape, an oval shape, a square shape, a rectangular shape, a regular polygonal shape, or the like.

Then, a bias is applied from the outside to the porous metal mesh using the porous metal mesh 40 fabricated on the surface of the gallium arsenide substrate 10 as an anode to wet-etch the gallium arsenide substrate in an etchant, thereby forming gallium arsenide semiconductor nanowires 60.

Figure 8:
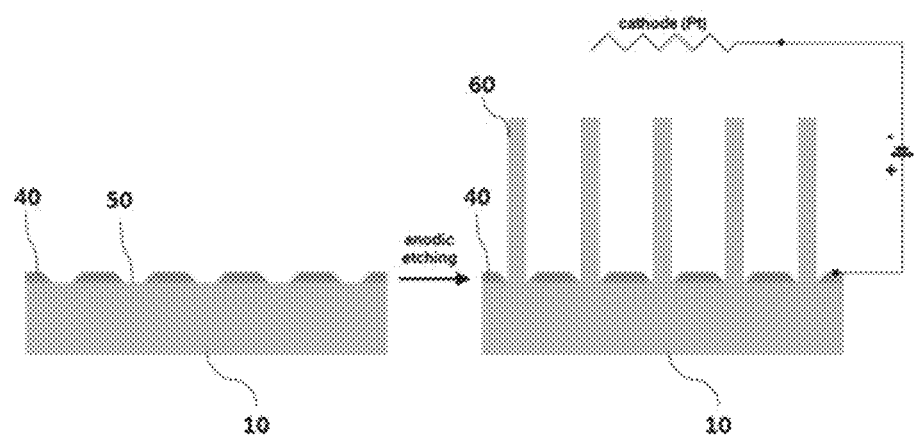
FIG. 8 is a view illustrating a method for fabricating a gallium arsenide nanowire array according to an exemplary embodiment of the present invention.

FIG. 8 is a schematic view illustrating a method for fabricating the gallium arsenide semiconductor nanowires 60 using the porous metal mesh 40 according to an exemplary embodiment of the present invention. At the time of performing the wet-etching, the bias is applied to porous metal mesh using the porous metal mesh 40 as the anode to attract electrons from the gallium arsenide substrate 10, thereby oxidizing the gallium arsenide substrate 10 below the porous metal mesh 40 to form an oxide layer below the metal, and the oxide layer is etched by the etchant used for the wet etching. A circulation reaction of the formation of the oxide layer and the etching is continuously performed, and only a region of the gallium arsenide substrate 10 contacting the porous metal mesh 40 is selectively removed by the etching. In an etching process, the porous metal mesh 40 acting on the anode remains on the surface of the gallium arsenide substrate 10, such that the gallium arsenide substrate below the porous metal mesh is continuously etched, and portions of the porous metal mesh that are not etched are nanowires formed in the top-down scheme.

Therefore, diameters of penetration holes 50 of the porous metal mesh 40 are transferred to reduced diameters of the gallium arsenide nanowires 60, the number of gallium arsenide nanowires 60 formed on the gallium arsenide substrate 10 is controlled by the number of penetration holes 50 formed in the porous metal mesh 40, and an array of the penetration holes 50 of the porous metal mesh 40 is transferred to an array of the gallium arsenide nanowires 60 formed on the gallium arsenide substrate 10. In addition, lengths of the gallium arsenide semiconductor nanowire 60 are adjusted by a depth of the etched gallium arsenide substrate 10, and the depth of the etched gallium arsenide substrate 10 may be easily adjusted by adjusting a time in which the wet etching is performed and a magnitude of the bias applied from the outside.

Hydrofluoric acid (HF), sulfuric acid ($H_2SO_4$), hydrochloric acid (HCl), nitric acid ($HNO_3$), or the like, may be used as the etchant used for the wet etching. In addition, the etchant may include an etchant diluted with deionized water, and may be a mixture of deionized water and anhydrous ethanol ($C_2H_5OH$).

Figure 9:
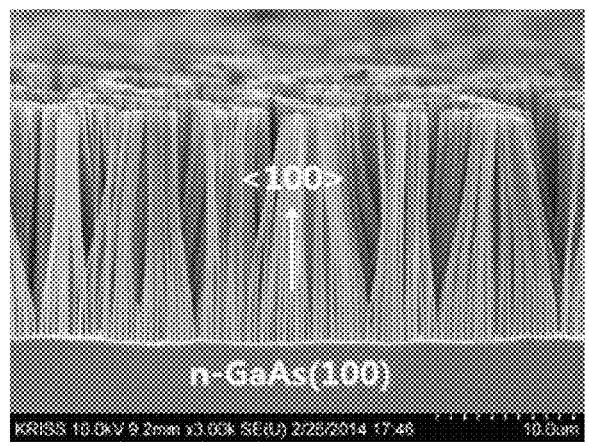
FIG. 9 is an SEM photograph of a gallium arsenide nanowire array fabricated by wet-etching an n-type (100) gallium arsenide substrate according to an exemplary embodiment of the present invention.
Figure 10:
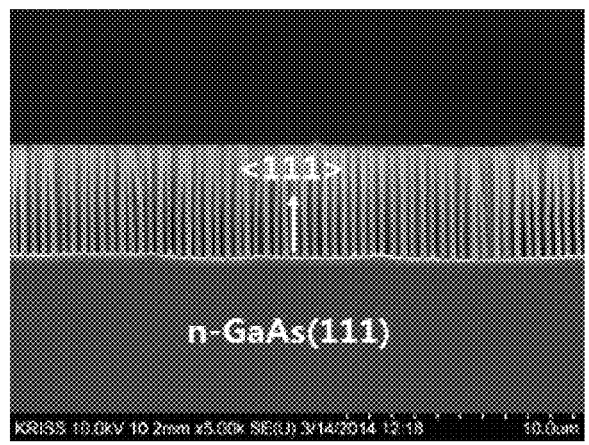
FIG. 10 is an SEM photograph of a gallium arsenide nanowire array fabricated by wet-etching an n-type (111) gallium arsenide substrate according to an exemplary embodiment of the present invention.
Figure 11:
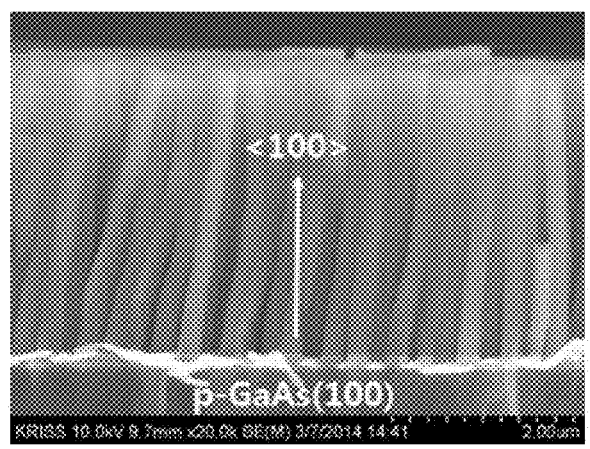
FIG. 11 is an SEM photograph of a gallium arsenide nanowire array fabricated by wet-etching a p-type (100) gallium arsenide substrate according to an exemplary embodiment of the present invention.

FIGS. 9 to 11 illustrate photographs of a gallium arsenide semiconductor nanowire 60 array aligned vertically from a substrate regardless of a type and a crystal orientation of the gallium arsenide substrate 10.

In detail, FIG. 9 is an SEM photograph of a vertically-aligned gallium arsenide semiconductor nanowire 60 array formed by wet-etching an n-type (100) gallium arsenide substrate 10 by the method described above, and it may be confirmed that nanowires are uniformly formed.

FIG. 10 is an SEM photograph of a vertically-aligned gallium arsenide semiconductor nanowire 60 array formed by wet-etching an n-type (111) gallium arsenide substrate 10 by the method described above.

FIG. 11 is an SEM photograph of a vertically-aligned gallium arsenide semiconductor nanowire 60 array formed by wet-etching a p-type (100) gallium arsenide substrate 10 by the method described above.

Figure 12:
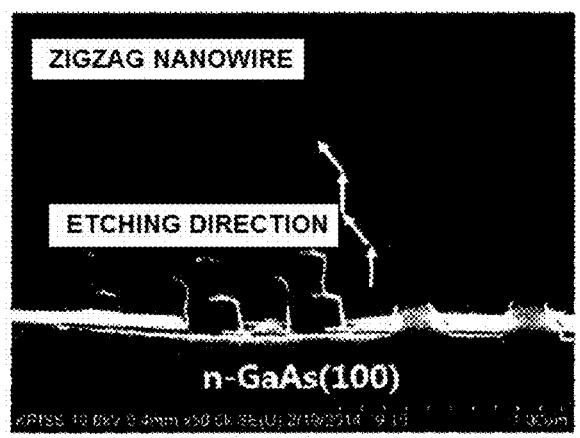
FIG. 12 is an SEM photograph of a gallium arsenide nanowire array in a zigzag form fabricated by wet-etching an n-type (100) gallium arsenide substrate according to an exemplary embodiment of the present invention.

In addition, according to an exemplary embodiment of the present invention, in a method for wet-etching the gallium arsenide substrate 10 using the method described above, a form of the bias applied to the porous metal mesh 40 is controlled, thereby making it possible to fabricate a gallium arsenide semiconductor nanowire 60 array of which various shapes and crystallographic orientations are controlled, rather than the vertically-aligned gallium arsenide semiconductor nanowire 60 array. FIG. 12 is an SEM photograph of a gallium arsenide semiconductor nanowire 60 array in a zigzag form fabricated by the porous metal mesh 40 at the time of wet-etching an n-type (100) gallium arsenide substrate 10 by the method described above.

Figure 13:
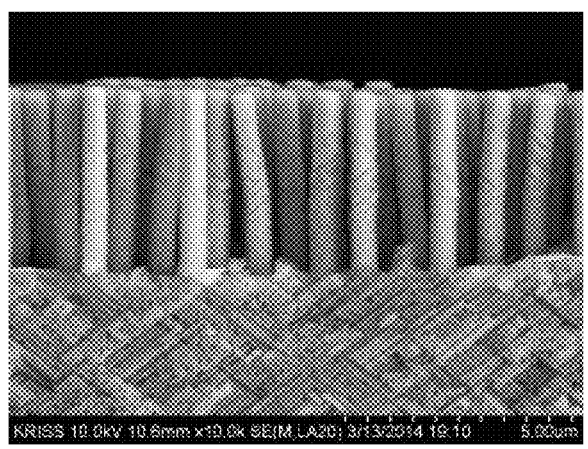
FIG. 13 is an SEM photograph of a porous gallium arsenide nanowire array fabricated by wet-etching an n-type (100) gallium arsenide substrate according to an exemplary embodiment of the present invention.

Further, in another exemplary embodiment of the present invention, after the bias is applied to the porous metal mesh 40 using the wet-etching method described above to form the vertically-aligned gallium arsenide nanowire array, a bias is applied to the gallium arsenide substrate, thereby making it possible to fabricate a vertically-aligned gallium arsenide semiconductor nanowire 60 array having a porous surface. FIG. 13 is an SEM photograph of the vertically-aligned gallium arsenide semiconductor nanowire 60 array having the porous surface, fabricated by the method described above.

Hereinafter, the present invention will be described in more detail through Inventive Examples. However, these Inventive Examples are only to illustrate the present invention, and it is not to be interpreted that the scope of the present invention is limited to these Inventive Examples.

Hereinafter, implementations of the present invention will be described in detail by Inventive Examples.

(Inventive Example 1) Method of Forming Vertical Nanowires of FIG. 9.

Pre-treatment of Gallium Arsenide Substrate

A n-type (100) gallium arsenide substrate, a n-type (111) gallium arsenide substrate, and a p-type (100) gallium arsenide substrate of iNexus Inc., were cleaned in a sequence of acetone, ethanol, deionized water and were dried to remove pollutants present on surfaces of these substrates, and wettability of the surfaces was improved using oxygen plasma (oxygen: 100 sccm, plasma power: 300 W, and time: 20 minutes).

Fabrication of Polystyrene Nanoparticle Monolayer Array

Polystyrene nanoparticles (having an average particle size of 250 nm) of Microparticles Inc., were mixed with propanol ($C_3H_7OH$) and were then injected into a surface of deionized water in a beaker using a syringe pump to uniformly form a polystyrene nanoparticle monolayer array having a hexagonal close-packed structure on the surface of the deionized water, and the polystyrene nanoparticle monolayer array was immersed using the pre-treated gallium arsenide substrate and was then slowly pulled up to transfer the polystyrene nanoparticles onto the surface of the gallium arsenide substrate.

Fabrication of Metal Mesh

Oxygen plasma treatment (oxygen: 100 sccm, plasma power: 300 W, and time: 20 minutes) was performed on the polystyrene nanoparticle monolayer array transferred onto the gallium arsenide substrate and aligned in the hexagonal close-packed structure to decrease sizes of polystyrene nanoparticles, and palladium (Pd) used as a material of an electrode at the time of fabricating a nanowire array was deposited. The metal may be deposited through plasma sputtering. After the metal is deposited, the gallium arsenide substrate was immersed in toluene and was subjected to ultrasonic treatment to completely remove the polystyrene nanoparticles aligned on the surface of the gallium arsenide substrate, thereby fabricating a porous metal mesh.

Fabrication of Gallium Arsenide Nanowire Array

The gallium arsenide substrate positioned on a surface of the metal mesh obtained by the method described above was immersed in hydrofluoric acid (HF), and a voltage (0.2V to 10.0V) or a current (0.5 to 50.0 mA) was applied to the metal mesh through external conducting wires to form a vertically-aligned gallium arsenide nanowire array of a large area. In this case, an aspect ratio (=length/diameter) of the obtained gallium arsenide nanowire is controlled by adjusting the applied voltage or current, a concentration of etchant, and an etching time.

(Inventive Example 2) Method of Forming Vertical Nanowires of FIG. 10.

Inventive Example 2 was the same as Inventive Example 1 except that the n-type (100) gallium arsenide substrate of Inventive Example 1 is changed into the n-type (111) gallium arsenide substrate.

(Inventive Example 3) Method of Forming Vertical Nanowires of FIG. 11.

Inventive Example 3 was the same as Inventive Example 1 except that the n-type (100) gallium arsenide substrate of Inventive Example 1 is changed into the p-type (100) gallium arsenide substrate.

(Inventive Example 4) Method of Forming Vertical Nanowires of FIG. 12.

In Inventive Example 4, the n-type (100) gallium arsenide substrate that is the same as that of Inventive Example 1 was used, and Inventive Example 4 was the same as Inventive Example 1 except that a form of a current is changed into a pulse form.

(Inventive Example 5) Method of Forming Vertical Nanowires of FIG. 13.

In Inventive Example 5, vertically-aligned nanowires were formed by the same method as that of Inventive Example 1, and Inventive Example 5 was the same as Inventive Example 1 except that a target to which a current or a voltage is applied is changed from a metal mesh into a GaAs substrate.

Special portions of contents of the present invention have been described in detail hereinabove, and it will be obvious to those skilled in the art that this detailed description is only an exemplary embodiment and the scope of the present invention is not limited by this detailed description. Therefore, the scope of the present invention will be defined by the claims and equivalents thereof.

DETAILED DESCRIPTION OF MAIN ELEMENTS

10: gallium arsenide substrate
20: polystyrene nanoparticle monolayer array
30: deionized water
40: porous metal mesh
50: hole of porous metal mesh
60: gallium arsenide semiconductor nanowire

The invention claimed is:

1. A method for fabricating a group III-V compound semiconductor nanowire array, comprising:
   (a) preparing a patterned palladium containing metal mesh on a surface of a group III-V compound semiconductor substrate; and (b) wet-etching the III-V compound semiconductor substrate contacting the metal mesh in an etchant by applying an external bias for electrochemical etching to the metal mesh, wherein a voltage or a current is applied to the metal mesh forming an anode and the substrate contacting the anode is etched which lowers the metal mesh, and wherein a portion of the substrate that does not contact the anode is not etched forming a mesh shape.

2. The method for fabricating a group III-V compound semiconductor nanowire array of claim 1, wherein the metal mesh is formed of an alloy of two or more elements or is formed of two or more metals deposited as multiple layers.

3. The method for fabricating a group III-V compound semiconductor nanowire array of claim 1, wherein a length of a nanowire is controlled by a time in which the wet-etching is performed or is controlled by a magnitude of the applied bias.

4. The method for fabricating a group III-V compound semiconductor nanowire array of claim 1, wherein the etchant includes hydrofluoric acid (HF), hydrochloric acid (HCl), or nitric acid (HNO3).

5. The method for fabricating a group III-V compound semiconductor nanowire array of claim 1, wherein in the wet-etching, a nanowire is fabricated to be vertical to the substrate or is fabricated in a zigzag form.

6. The method for fabricating a group III-V compound semiconductor nanowire array of claim 1, wherein in the wet-etching, the bias is applied to the substrate to induce a nanowire to have a porous surface.

7. The method for fabricating a group III-V compound semiconductor nanowire array of claim 1, wherein in the wet-etching, a diameter of a nanowire is adjusted depending on a change in a size of a hole of the metal mesh.

8. The method for fabricating a group III-V compound semiconductor nanowire array of claim 1, wherein a group III-V compound semiconductor is a gallium arsenide.

* * * * *